(12) United States Patent
Thaller

(10) Patent No.: US 7,629,856 B2
(45) Date of Patent: Dec. 8, 2009

(54) DELAY STAGE, RING OSCILLATOR, PLL-CIRCUIT AND METHOD

(75) Inventor: Edwin Thaller, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 11/588,877

(22) Filed: Oct. 27, 2006

(65) Prior Publication Data

US 2008/0111638 A1 May 15, 2008

(51) Int. Cl.
  *H03K 3/03* (2006.01)
(52) U.S. Cl. .................. 331/57; 327/158; 327/274; 327/284; 327/287
(58) Field of Classification Search .............. 331/57, 331/45; 327/149, 153, 158, 161, 266, 274, 327/277, 280, 284, 287
See application file for complete search history.

(56) References Cited

U.S. PATENT DOCUMENTS

| | | | | |
|---|---|---|---|---|
| 5,208,557 A | * | 5/1993 | Kersh, III | 331/57 |
| 5,239,274 A | * | 8/1993 | Chi | 331/57 |
| 5,477,198 A | * | 12/1995 | Anderson et al. | 331/177 R |
| 5,783,953 A | * | 7/1998 | Bosnyak et al. | 327/101 |
| 5,952,891 A | * | 9/1999 | Boudry | 331/57 |
| 6,072,372 A | * | 6/2000 | Yokoyama | 331/57 |
| 6,469,585 B1 | * | 10/2002 | Dai et al. | 331/57 |
| 7,263,152 B2 | * | 8/2007 | Miller et al. | 375/371 |
| 7,324,789 B2 | * | 1/2008 | Jensen | 455/76 |

* cited by examiner

*Primary Examiner*—Robert Pascal
*Assistant Examiner*—Levi Gannon
(74) *Attorney, Agent, or Firm*—Lee & Hayes, PLLC

(57) ABSTRACT

A delay stage for a semiconductor device includes at least one delay branch and at least one controllable switching apparatus. The at least one controllable switching apparatus is configured to connect a predefined amount of the at least one delay branch to a supply voltage.

52 Claims, 10 Drawing Sheets

DELAY STAGE, RING OSCILLATOR, PLL-CIRCUIT AND METHOD

BACKGROUND OF THE INVENTION

The present invention relates to a delay stage for a semiconductor device. The invention further relates to a ring oscillator, a PLL-circuit and a method for operating the delay stage.

A typical delay circuit delivers an output pulse at some predetermined delay time after receiving an input pulse. The predetermined delay period, that is the period between the input and output pulses, must be accurate and repeatable. Those delay circuits comprise a delay stage especially for use in a semi-conductor device, such as an oscillator.

There are numerous electronic circuit applications where, for proper operation, it is necessary to provide precise timing or synchronization of one portion of the circuit with another one. Such timing is conveniently provided by an oscillator whose frequency is sufficiently accurate for the requirements of the circuit being timed or synchronized. Depending on the degree of accuracy required, an oscillator may be very simple where the frequency range can have wide latitude on the one hand or relatively complex where a high degree of accuracy in frequency is required.

Various kinds of oscillators have been used for onboard timing of other circuitry. One kind of oscillator which lends itself particularly well to implementations in CMOS technology is a ring oscillator. A ring oscillator is an electronic oscillator which oscillates independently and does not need any external components, such as capacitors or coils, which in other oscillators are used to accurately set the frequency of operation. Instead of these capacitor or inductor tuned circuits, a ring oscillator has number of simple inverting stages. These stages of a ring oscillator are commonly also referred to as delay stages or delay cells. The frequency of operation of a ring oscillator is determined by the speed of progression of a switching event from one delay stage to another around the ring of the ring oscillator and by the number of delay stages.

A conventional ring oscillator may have its own frequency of operation within a very wide range of frequencies. However, by way of example, in a CMOS based ring oscillator currently being manufactured as part of a CMOS IC chip, the difference in frequency of the oscillator of one chip from the frequency of the oscillator of another supposedly identical chip can be rather great. This wide range of frequency of operation and thus the performance of ring oscillator circuits subject to at least three significant basic tolerances: supply voltage fluctuations, temperature variations, and basic process variations from chip to chip. Therefore, where precise timing is required, e. g. frequency accuracy, to within a few percent, such wide frequency ranges are not or not throughout acceptable. Because of the above mentioned variations, ring oscillators have generally been deemed overly unstable and subject to frequency drift.

If a commonly known ring oscillator is used, for example, in a PLL-circuit (PLL: Phase Locked-Loop). The large variation in the oscillator gain causes an unwanted large variation in the PLL-bandwidth. A frequency divider of the PLL-circuit which is connected to an output of the ring oscillator must therefore be designed for the highest possible oscillation frequency of the ring oscillator. However, frequency dividers for high frequencies usually consume more power than frequency dividers which are designed for lower frequencies.

SUMMARY

At least a first embodiment of the invention is a delay stage for a semiconductor device that includes at least one delay branch and at least one controllable switching apparatus. The at least one controllable switching apparatus is configured to connect a predefined amount of the at least one delay branch to a supply voltage.

Other features and embodiments of the invention will become readily apparent to those of ordinary skill in the art by reference to the following detailed description and accompanying drawings.

BRIEF DESCRIPTION OF THE DRAWINGS

For a more complete understanding of the embodiments of the present invention, reference is now made to the following description taken in conjunction with the accompanying drawings. Exemplary embodiments are explained in more detail below using the schematic figures of the drawing, in which.

In all figures of the drawings, elements, features and signals which are the same or have the same function have been provided with the same reference symbols—unless stated otherwise.

DESCRIPTION OF EMBODIMENTS

Figure 1:
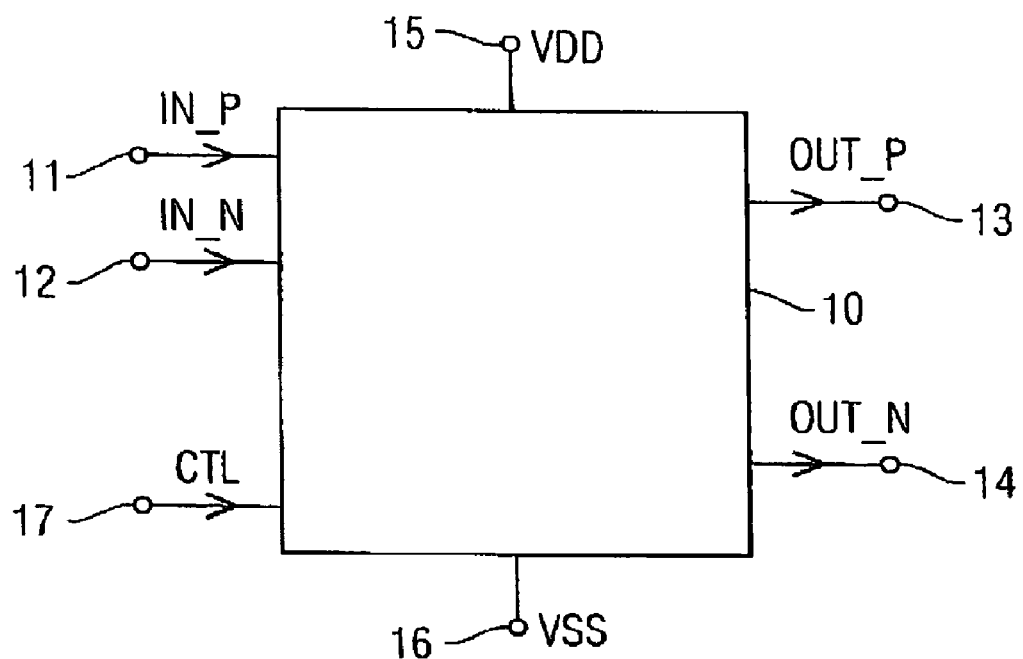
FIG. 1 shows a block-diagram illustrating a delay stage according to an embodiment of the present invention.

According to one embodiment, a voltage controlled oscillator (VCO) is provided which shows a programmable oscillation frequency range and a programmable gain of the oscillator by programming its delay stages.

According to another embodiment of the delay stage, the capacitive load at the output of this delay stage typically is constant. To switch between different oscillation frequency ranges and gains of the voltage controlled oscillator parallel delay branches inside the stage are typically digitally switched on or switched off to increase or decrease, respectively, the gain of the delay stage and, thus, increase or decrease, respectively, the oscillation frequency of the oscillator. With this implementation, only the delay branches that are turned on and which are connected to the supply voltage are consuming power. The power consumption and the oscillation frequency is therefore highly linear proportional to the number of activated delay branches within the delay stage which are connected to the supply voltage. Variations in the gain of the oscillator which is caused by process and temperature variations can be compensated in this way.

To compensate for process variations, typically, a start-up tuning circuit can be provided to tune the oscillator to the desired maximum oscillation frequency. This start-up circuit will usually start with the lowest possible frequency range (for example, when only one of the parallel delay branches of the delay stage is switched on) and increase the number of delay branches step by step until the desired maximum frequency is reached. At the output of the oscillator, usually one or more frequency divider is connected. For conventional oscillators, the dividers must be designed to function at the highest possible frequency of the oscillator. For this new kind of programmable oscillator, the operation range of the dividers can be reduced to the highest frequency of the oscillator which is programmed to oscillate inclusive some safety margin.

According to one embodiment, a delay stage for a semiconductor device is provided, comprising at least one delay branch, at least one controllable switching apparatus to connect a predefined amount of the at least one delay branch to a supply voltage.

In a further embodiment at least two different delay branches are provided and the at least one controllable switching apparatus is designed to connect a predefined amount of the delay branches in parallel to each other to provide different frequency ranges depending on the amount of parallel connected delay branches.

In a further embodiment at least one output terminal for providing corresponding output signals having an output frequency set up by the controllable switching apparatus are provided.

In a further embodiment the switching apparatus comprises controllable switches to connect the delay branches in parallel to each other.

In a further embodiment the switching apparatus comprises controllable switches to connect the at least one delay branch to the supply voltage.

In a further embodiment at least one control terminal to receive at least one control signal is provided, wherein the at least one control terminal is connected to corresponding control terminals of the controllable switching apparatus.

In a further embodiment an input terminal is provided to receive an input signal.

In a further embodiment a first supply terminal to receive a first supply potential and a second supply terminal are provided to receive a second supply potential wherein the second supply potential is lower than the first supply potential and wherein the supply voltage is derived from the first and the second supply potential.

In a further embodiment the first supply potential is a positive supply potential and the second supply potential is a negative supply potential.

In a further embodiment within at least one of the delay branches this delay branch is connectable to the first supply terminal via a first controllable switch and this delay branch is further connectable to the second supply terminal via a second controllable switch, wherein when the first and second controllable switches are switched off the delay branch is disconnected from the supply voltage and when the first and second controllable switches are switched on the delay branch is connected to the supply voltage.

In a further embodiment the first and second controllable switches are semiconductor switches.

In a further embodiment the first and second controllable switches are CMOS-based transistors.

In a further embodiment the first and second controllable switches are digital switches which are designed to connect or disconnect a corresponding delay branch digitally by applying a digital control signal to their control terminals.

In a further embodiment each one of the delay branches comprises at least one inverter.

In a further embodiment the inverter is connected to an input terminal to receive an input signal, wherein the inverter is connected via the switching apparatus to the supply voltage and wherein the inverter is connected to an output terminal to provide the output signal.

In a further embodiment all inverters are connected to a common input terminal and a common output terminal.

In a further embodiment each one of the inverters comprises a low output impedance and wherein each one of the inverters is designed to load and unload a capacitive load of a further delay stage connectable downstream to an output terminal of the delay stage.

In a further embodiment the delay stage is a differential delay stage, which is composed in differential circuitry.

In a further embodiment the differential delay stage comprises two complementary input terminals to receive complementary input signals and two complementary output terminals to provide complementary output signals.

In a further embodiment the differential delay stage comprises at least one pair of complementary delay branches each comprising a first and a second branch, wherein each one of the first and second branch within a pair of complementary delay branches comprises an inverter.

In a further embodiment a positive feedback circuit is provided which is arranged between the first and second branches of the at least one pair of complementary delay branches and which provides a positive feedback signal for each one of the first and second branch to support the oscillation.

In a further embodiment the positive feedback circuit comprises two transistors which are cross-coupled to each other with regard to their control terminals and output terminals.

Embodiments of the invention further provide a ring oscillator circuit, comprising a first delay stage and at least one second delay stage coupled to the first delay stage, wherein at least one of the first and second delay stages comprising at least one delay branch and at least one controllable switching apparatus to connect a predefined amount of the at least one delay branch of the corresponding delay stage to a supply voltage.

In a further embodiment of the oscillator at least two different delay branches are provided within the at least one first and second delay stages and the at least one controllable switching apparatus is designed to connect a predefined amount of the delay branches in parallel to each other to provide different frequency ranges depending on the amount of parallel connected delay branches.

In a further embodiment the switching apparatus comprises controllable switches to connect the delay branches within the at least one first and second delay stages in parallel to each other.

In a further embodiment the switching apparatus comprises controllable switches to connect the at least one delay branch within the at least one first and second delay stages to the supply voltage.

In a further embodiment an oscillator output terminal is provided for providing an oscillator output signal having an oscillator frequency set up by the first and second delay stages.

In a further embodiment each one of the delay stages comprises at least one input terminal and at least one output terminal, wherein the output terminals of the second delay stage are connected to the input terminals of the first delay stage and wherein the input terminals of the second delay stage are connected to the output terminals of the first delay stage.

In a further embodiment a supply voltage tuning circuit is provided to tune at least one of the first or the second supply potentials.

In a further embodiment a start-up tuning circuit is provided to tune the oscillator to the maximum oscillation frequency.

In a further embodiment at least one frequency divider is provided, which is arranged in series connection with respect to the output terminal of the second delay stage.

In a further embodiment the frequency dividers are designed to operate at the highest possible frequency of the oscillator.

In a further embodiment the frequency dividers are designed to operate at the highest actual programmed frequency of the oscillator.

In a further embodiment the oscillator is a voltage controlled oscillator.

Embodiments of the invention further provide a PLL-circuit comprising an oscillator wherein the oscillator comprises a first delay stage and at least one second delay stage coupled to the first delay stage, wherein at least one of the first and second delay stages comprising at least one delay branch and at least one controllable switching apparatus to connect a predefined amount of the at least one delay branch of the corresponding delay stage to a supply voltage.

In a further embodiment of the PLL-circuit the oscillator is a ring oscillator.

In a further embodiment a first input terminal to receive an input signal, an output terminal to provide an output signal and a second input terminal to receive a second input signal derived from the output signal are provided.

In a further embodiment a phase detector and a loop filter is provided wherein the phase detector, the loop filter and the oscillator are arranged one after the other and between the input terminals and the output terminal.

In a further embodiment the phase detector is a phase frequency detector.

In a further embodiment the phase detector is designed to generate a phase difference signal, which indicates the phase difference between the first and the second input signals.

In a further embodiment the loop filter is a digital loop filter.

In a further embodiment the loop filter comprises a low-pass filter to filter the phase difference signal and to provide a filtered phase difference voltage signal.

In a further embodiment the oscillator is controlled by the filtered phase difference voltage signal and the oscillator then generates the output signal of the PLL-circuit wherein the output signal has the predefined frequency range.

Embodiments of the invention further provide a method for operating a delay stage for a semiconductor device, comprising: providing at least one delay branch and at least one controllable switching apparatus; and switching at least one switch by providing corresponding control signals to corresponding control terminals of the corresponding switches to connect a predefined amount of the at least one delay branch of the corresponding delay stage to a supply voltage.

In a further embodiment the predefined amount of delay branches are connected in parallel to each other to provide different frequency ranges depending on the amount of parallel connected delay branches.

In a further embodiment an output frequency of an output signal of the delay stage is set up by switching the at least one switch.

In a further embodiment an output frequency of an output signal of the delay stage is set up by switching the at least one switch of a switched capacitor network able switch to connect at least one capacitor to an output terminal of the delay stage.

Embodiments of the invention further provide a method for operating a ring oscillator circuit, comprising: providing a first delay stage and at least one second delay stage coupled to the first delay stage, wherein at least one of the first and second delay stages comprising at least one delay branch and at least one switching apparatus; and switching at least one switch of the switching apparatus by providing corresponding control signals to corresponding control terminals of the corresponding switches to connect a predefined amount of the at least one delay branch of the corresponding delay stage to a supply voltage.

In a further embodiment the predefined amount of delay branches are connected in parallel to each other.

In a further embodiment at least one supply potential is tuned.

In a further embodiment the oscillator is tuned to a maximum oscillation frequency.

In a further embodiment the oscillator is designed to operate at a highest possible frequency.

In a further embodiment the oscillator operates at a highest actual programmed frequency.

Other exemplary embodiments of the invention are explained in more detail in the schematic figures of the drawing.

FIG. 1 shows a block-diagram illustrating a delay stage according to an embodiment of the present invention.

In FIG. 1, the delay stage is denoted by reference symbol 10. According to an exemplary embodiment, the delay stage 10 is designed for inclusion in a voltage controlled oscillator (VCO), such as a ring oscillator.

The delay stage 10 comprises two input terminals 11, 12 for receiving complementary input signals IN_P, IN_N. The delay stage 10 further comprises two output terminals 13, 14 to provide complementary output signals OUT_P, OUT_N.

The delay stage 10 further comprises a first supply terminal 15 for a first supply potential VDD, for example a positive supply potential VDD, and a second supply terminal 16 for a second supply potential VSS, for example a negative potential VSS or a reference potential VSS, such as the ground potential.

The delay stage 10 further comprises at least one control terminal 17. According to an embodiment, this control terminal 17 is designed to receive a control signal CTL.

Figure 2:
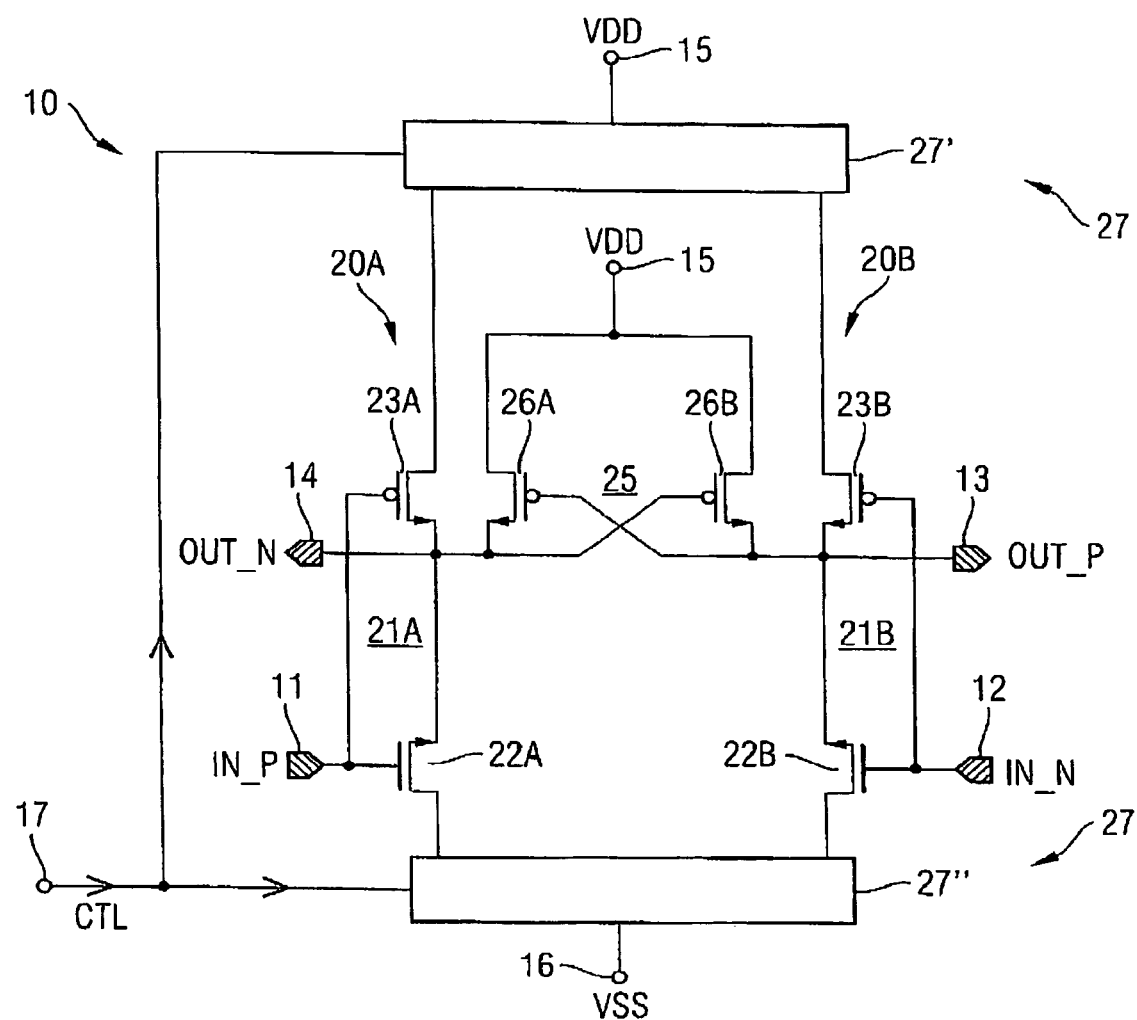
FIG. 2 shows a circuit arrangement of a single delay stage according to the embodiment in FIG. 1.

FIG. 2 shows a circuit arrangement of the single delay stage as shown in FIG. 1. The delay stage 10 comprises a first branch 20A and a second complementary branch 20B. Both branches 20A, 20B are arranged in parallel to each other and between the first and second supply terminals 15, 16. The two branches 20A, 20B form a pair of parallel arranged branches.

Hereinafter, the elements assigned to the first branch 20A are provided with an index "A" within the corresponding reference symbol, and the elements assigned to the thereto complementary branch 20B are furnished by an index "B" within the corresponding reference symbol.

Each one of the branches 20A, 20B comprises an inverter 21A, 21B.

The first inverter 21A within the first branch 20A comprises two transistors 22A, 23A of opposite conductivity types. In the present example, a first transistor 22A of the inverter 21A is a PMOS type transistor and the second transistor 23A of the inverter 21A is an NMOS type transistor. The control terminals of these transistors 22A, 23A of the first branch 20A, i.e. their gate terminals, are connected to the input terminal 11 to receive the input signal IN_P. The conduction paths of both transistors 22A, 23A of the first inverter 21A are arranged in series connection to each other and between the first and second supply terminals 15, 16. A tap 24A between the first and second transistor 22A, 23A is connected to the output terminal 14 for providing the complementary output signal OUT_N.

Similarly, also the second inverter 21B within the second branch 20B comprises two transistors 22B, 23B of opposite conductivity types (PMOS, NMOS) with their control terminals connected to the input terminal 12 for receiving the complementary input signal IN_N and with a tap 24B between the conduction paths of these transistors 22B, 23B connected to the output terminal 13 for providing the output signal OUT_P.

The delay stage 10 further comprises a positive feedback circuit 25. The positive feedback circuit 25 is arranged between the two complementary branches 20A, 20B within the pair of branches. The positive feedback circuit 25 comprises two NMOS type transistors 26A, 26B wherein a first one of these transistors 26A, 26B is assigned to the first branch 20A and wherein a second one of these transistors 26A, 26B is assigned to the second complementary branch 20B. The conduction paths of these transistors 26A, 26B are both arranged between the first supply terminal 15 and the tap 24A, 24B which corresponds to the corresponding branch 20A, 20B. The control terminals of the transistors 26A, 26B are cross-coupled to each other wherein the control terminal of the transistor 26A is connected to the tap 24B of the opposite branch 20B and the control terminal of the transistor 26B is connected to the tap 24A of the opposite branch 20A. The positive feedback circuit 25 is designed for providing a positive feedback signal for each one of the first and second branches 20A, 20B to support the oscillation of these branches 20A, 20B.

The delay stage 10 in FIG. 2 further comprises a switching apparatus 27. In the present embodiment, a first part 27' of the switching apparatus 27 is arranged between the first supply terminal 15 and the two branches 20A, 20B and the second part 27" of the switching apparatus is arranged between the second supply terminal 16 and the two branches 20A, 20B. Each part 27', 27" of the switching apparatus 27 is connected on the input side to the control terminal 17 to receive the control signal CTL.

FIG. 3 shows a circuit arrangement of a single delay stage as shown in FIG. 2 in more detail.

Figure 3A:
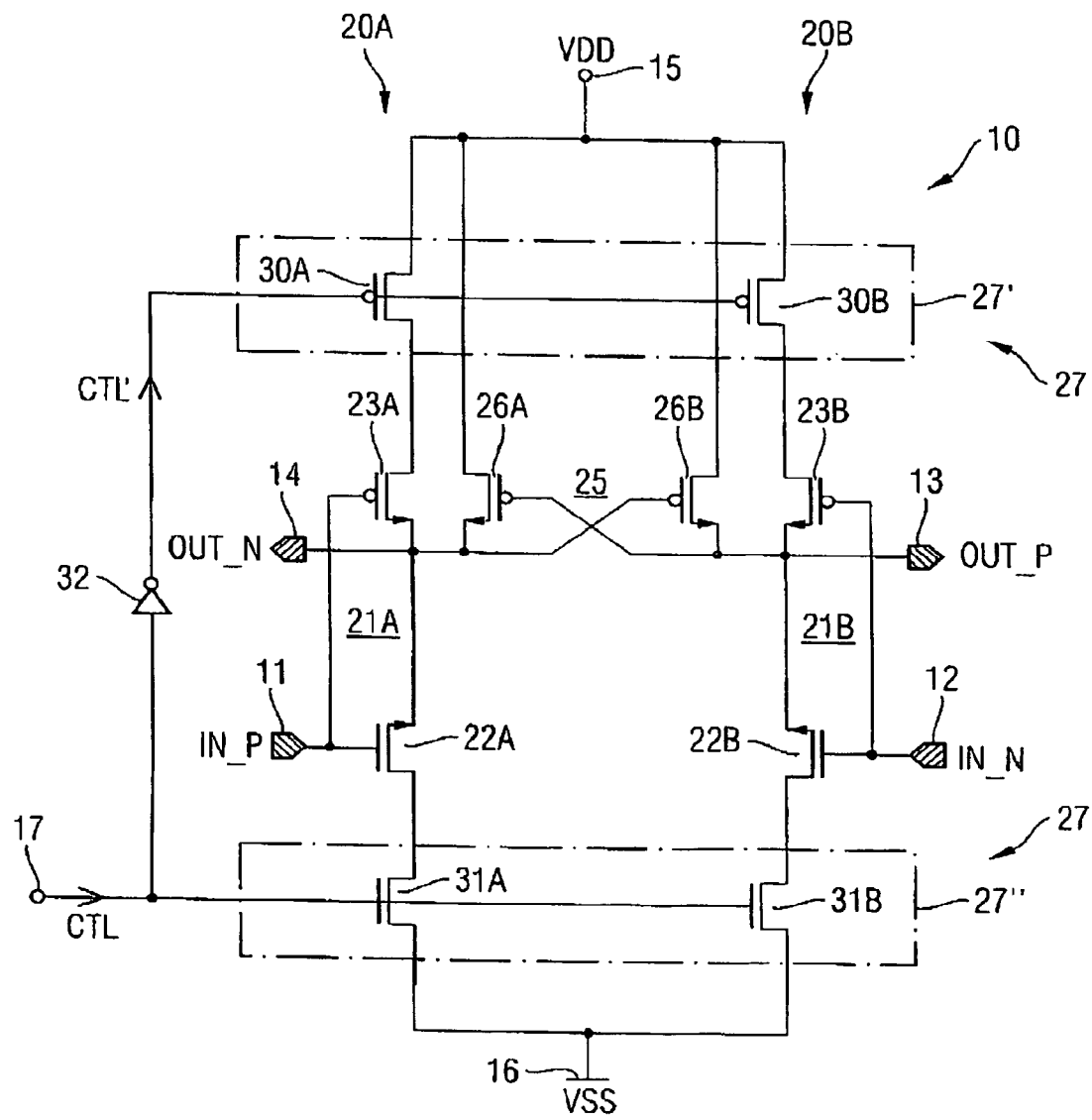
FIG. 3A shows a first example of a circuit arrangement of a single delay stage according to the embodiment in FIG. 2.

In the embodiment in FIG. 3A, the switching apparatus 27 comprises four transistors 30A, 30B, 31A, 31B. The different transistors 30A, 30B, 31A, 31B are arranged along in series with the conduction paths of the inverters 21A, 21B. Within each one of these branches 20A, 20B, a PMOS transistor 31A, 31B and an NMOS transistor 30A, 30B are provided. These transistors 30A, 30B, 31A, 31B of the switching apparatus 27 and the transistors 23A, 22A, 23B, 22B of the inverter 21A, 21B within a branch 20A, 20B are arranged in series connection with regard to their conduction paths. Therefore, these transistors 30A, 30B, 31A, 31B act as switch-on/switch-off devices within the corresponding branch 20A, 20B for connecting and disconnecting the corresponding branch 20A, 20B.

With regard to the first branch 20A, an NMOS transistor 30A and a PMOS transistor 31A are provided. The conduction path of the NMOS transistor 30A is arranged between the transistor 23A and the supply terminal 15. The conduction path of the PMOS transistor 31A is arranged between the transistor 23A and the second supply terminal 16. The control terminal of the PMOS transistor 31A is directly connected to the control terminal 17 to receive the control signal CTL, whereas the control terminal of the NMOS transistor 30A is connected via an inverter 32 to the control terminal 17. The inverter 32 inverts the control signal CTL and provides an inverted control signal CTL'.

By providing this additional inverter 32, it is possible to switch both of these transistors 30A, 31A "OFF" and "ON" by the same control signal CTL. However, this functionality may also be provided by two complementary control signals (not shown in FIG. 3A). Also, it may be possible to use transistors 30A, 31A of the same conductivity type which are then controllable by the same control signal CTL. In both cases, the inverter 32 is not necessary any more since both of these transistors 30A, 31A of the switching apparatus 27 are switched "OFF" and "ON" by the same control signal CTL.

Also, within the complementary path 20B, an NMOS transistor 30B and a PMOS transistor 31B are provided, which are connected in similar connection as the transistors 30A, 31A in the first branch 20A.

The transistors 30A, 30B, 31A, 31B of the switching apparatus 27 which are controlled by the same control signal CTL are used to supply the supply voltage V1=VDD−VSS to the inverters 21A, 21B. Therefore, these transistors 30A, 30B, 31A, 31B are used for disconnecting and connecting these inverters 21A, 21B by simply switching these transistors 30A, 30B, 31A, 31B "OFF" and "ON", respectively.

It is self understood that the circuit arrangements shown with regard to the FIGS. 1-3A illustrate the minimum circuitry of the circuitry of a single delay stage. In this delay stage comprising only one branch and one complementary branch the oscillator will stop oscillating if the switches are turned off.

Figure 3B:
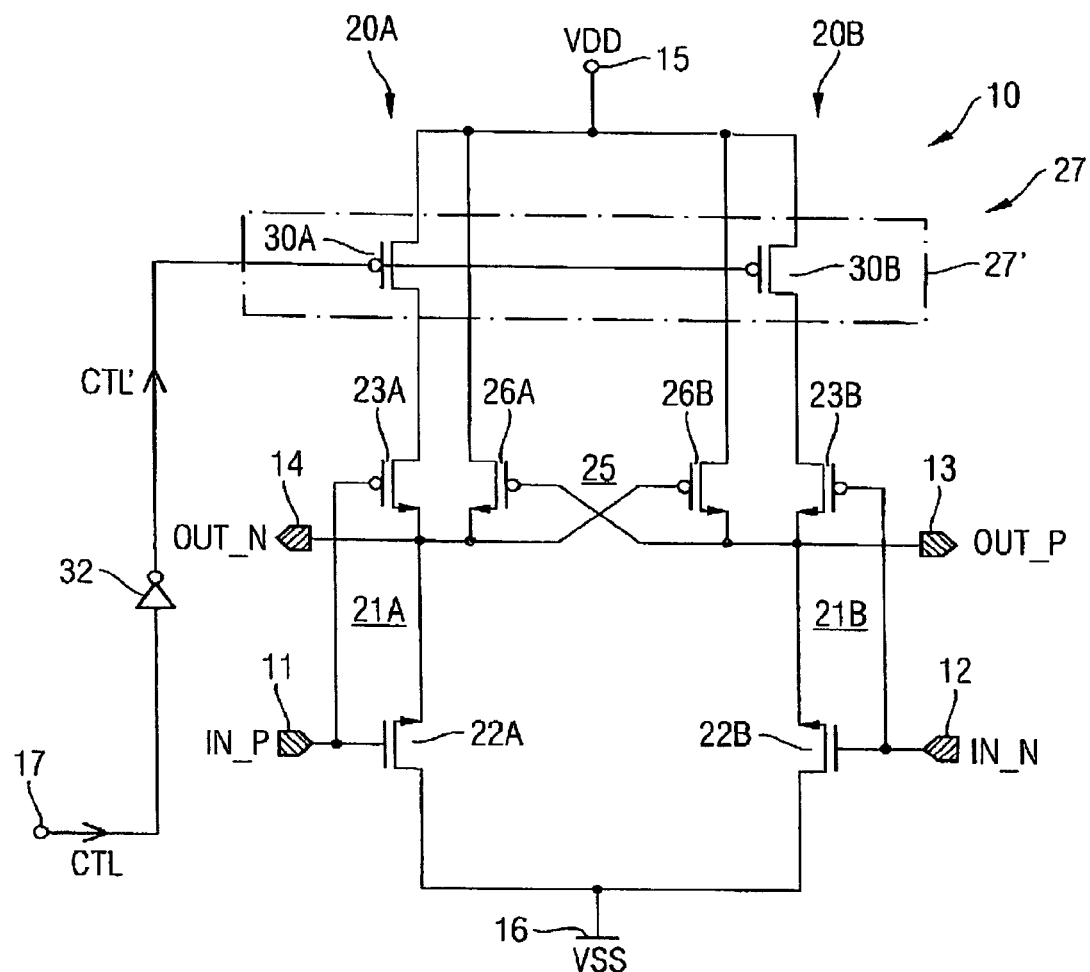
FIG. 3B shows a second example of a circuit arrangement of a single delay stage according to the embodiment in FIG. 2.

FIG. 3B shows a second example of a second arrangement of a single delay stage according to the embodiment in FIG. 2.

Unlike the first example in FIG. 3A the second example of a delay cell 10 in FIG. 3B the switching apparatus 27 only comprises one switching part 27'. That means the switching apparatus only comprises switches 30A, 30B on the side of the first supplied potential VDD. It is not necessary—in principal—to use as well the switches on the first supply potential VDD and the second supply potential VSS. The corresponding branch of a delay cell 10 can also be switched off and on with one switch within a branch. Instead of using the transistors 30A, 30B within the first switching part 37' it is also possible to use only the transistors 31A, 31B of the second switching part 27' of the switching apparatus 27 which are then arranged between the transistors 22A, 22B and a second supply potential VSS.

Figure 3C:
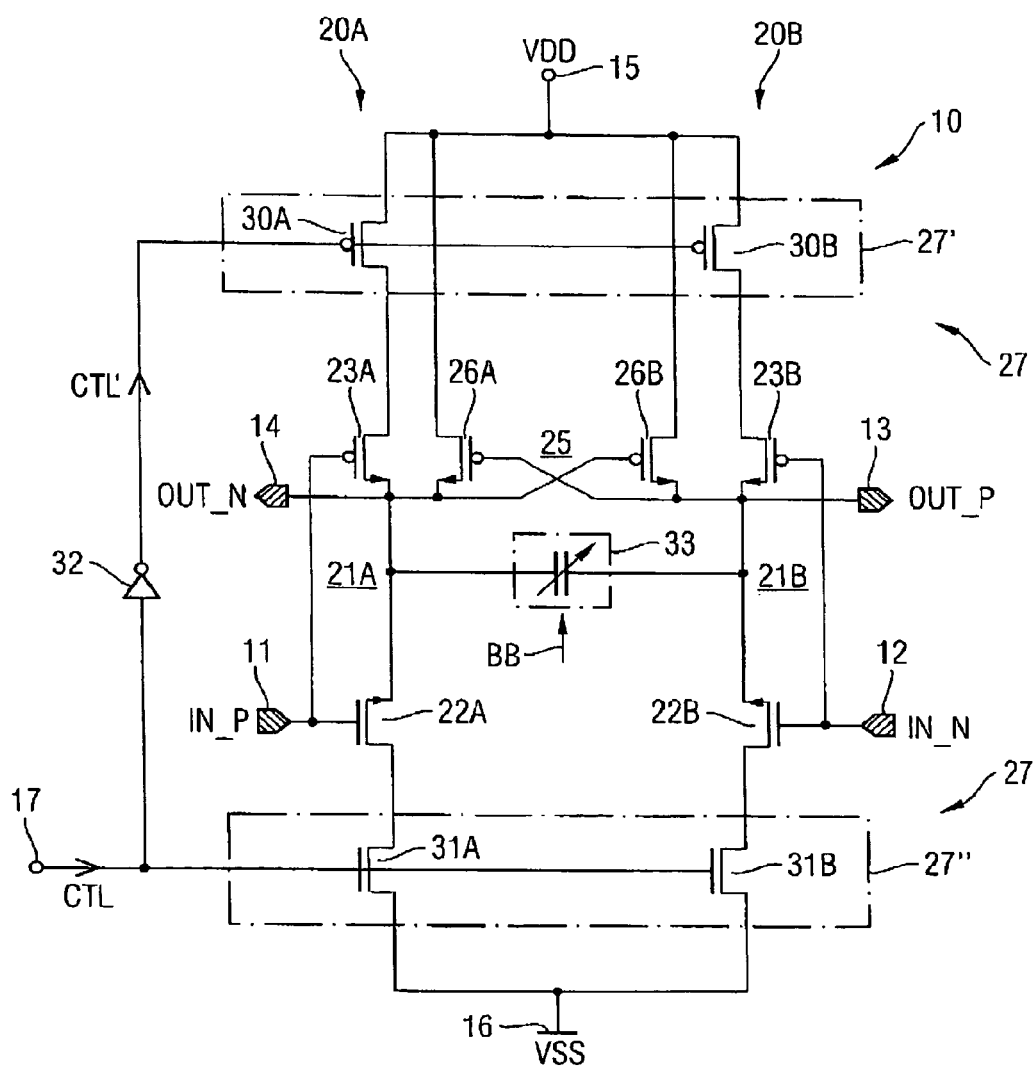
FIG. 3C shows a third example of a circuit arrangement of a single delay stage according to the embodiment in FIG. 2.

FIG. 3C shows a third example of a circuit arrangement of a single delay stage according to the embodiment in FIG. 2. Here, between the two branches 20A, 20B especially between the parts of the two branches 20A, 20B within the two inverters 21A, 21B a switched capacitor apparatus 33 is provided. This switched capacitor apparatus 33 is controllable by control signals BB. In FIG. 3C only one switched capacitor apparatus 33 is shown, however, the switched capacitor apparatus 33 may comprise one or more switchable capacitors or varactors which are arranged in parallel to each other and which are controllable by different control signals BB in order to switch the desired one of this capacitors or varactors in parallel to each other.

Figure 3D:
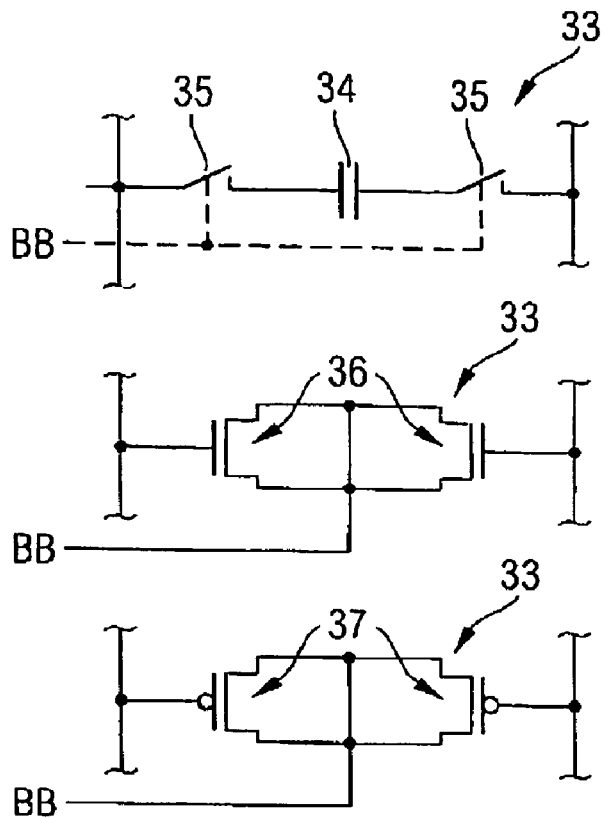
FIG. 3D shows some examples of switched capacitors usable in the circuit arrangement shown in FIG. 3C.

FIG. 3D shows three different versions for the implementation of the switched capacitor apparatus 33 as shown in FIG. 3C. In the above part of FIG. 3D the switched capacitor apparatus 33 comprises a capacitor 34 which is switchable by using suitable switches 35. In the other two versions of a switched capacitor apparatus 33 its functionality is realized by two transistors 36, 37. The control terminals of the two transistors within a switched capacitor apparatus 33 is connected to a corresponding one of the branches 20A, 20B. The conduction paths of these two transistors 36, 37 within the switched capacitor apparatus 33 is arranged in parallel to each other and the two load terminals of these transistors 36, 37 are shortened and connected to the control terminal to receive the corresponding control signal BB. The transistors 36, 37 can be realized by PMOS transistors 36 (as shown in the middle part of FIG. 3D) or NMOS transistors (as shown in the bottom part of FIG. 3D).

By providing a switched capacitor apparatus 33 it is possible to realize one or more switchable capacitors or varactors within a delay cell 10. These switched capacitors of varactors can be used to increase or decrease the oscillation frequency of an oscillator in one or more discrete steps.

Figure 4:
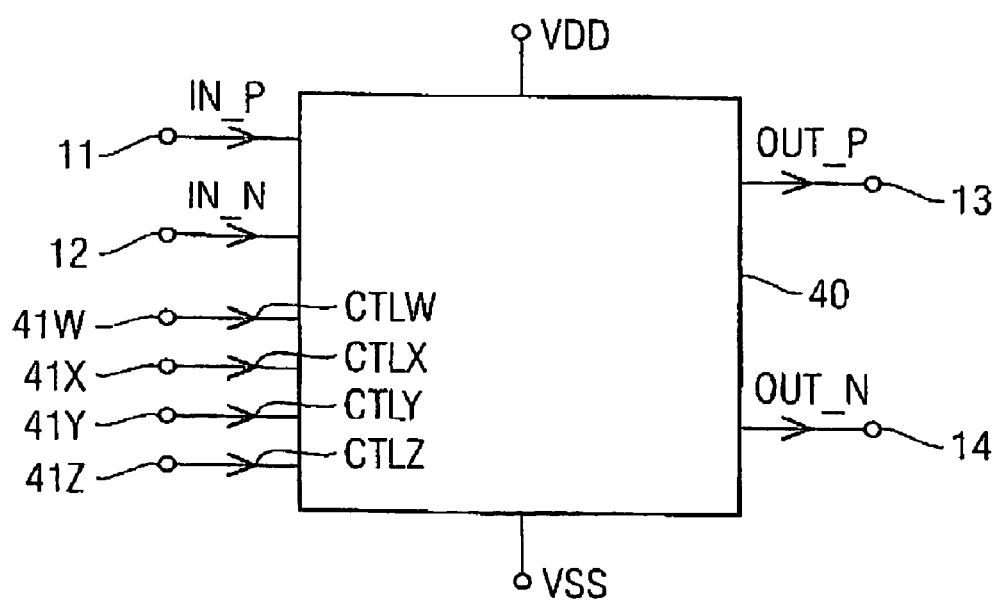
FIG. 4 shows a block-diagram illustrating a delay stage according to another embodiment of the present invention.

FIG. 4 shows a block-diagram illustrating a delay stage according to another embodiment of the present invention. The delay stage in FIG. 4 is denoted by reference symbol 40. Unlike the exemplary embodiment in FIGS. 1-3D, the delay stage 40 shown in FIG. 4 comprises in addition to the complementary input terminals 11, 12, the complementary output terminals 13, 14 and the two supply terminals 15, 16 altogether four control terminals 41W-41Z. Each one of these control terminals 41W-41Z is used to receive a control signal CTLW-CTLZ.

Figure 5:
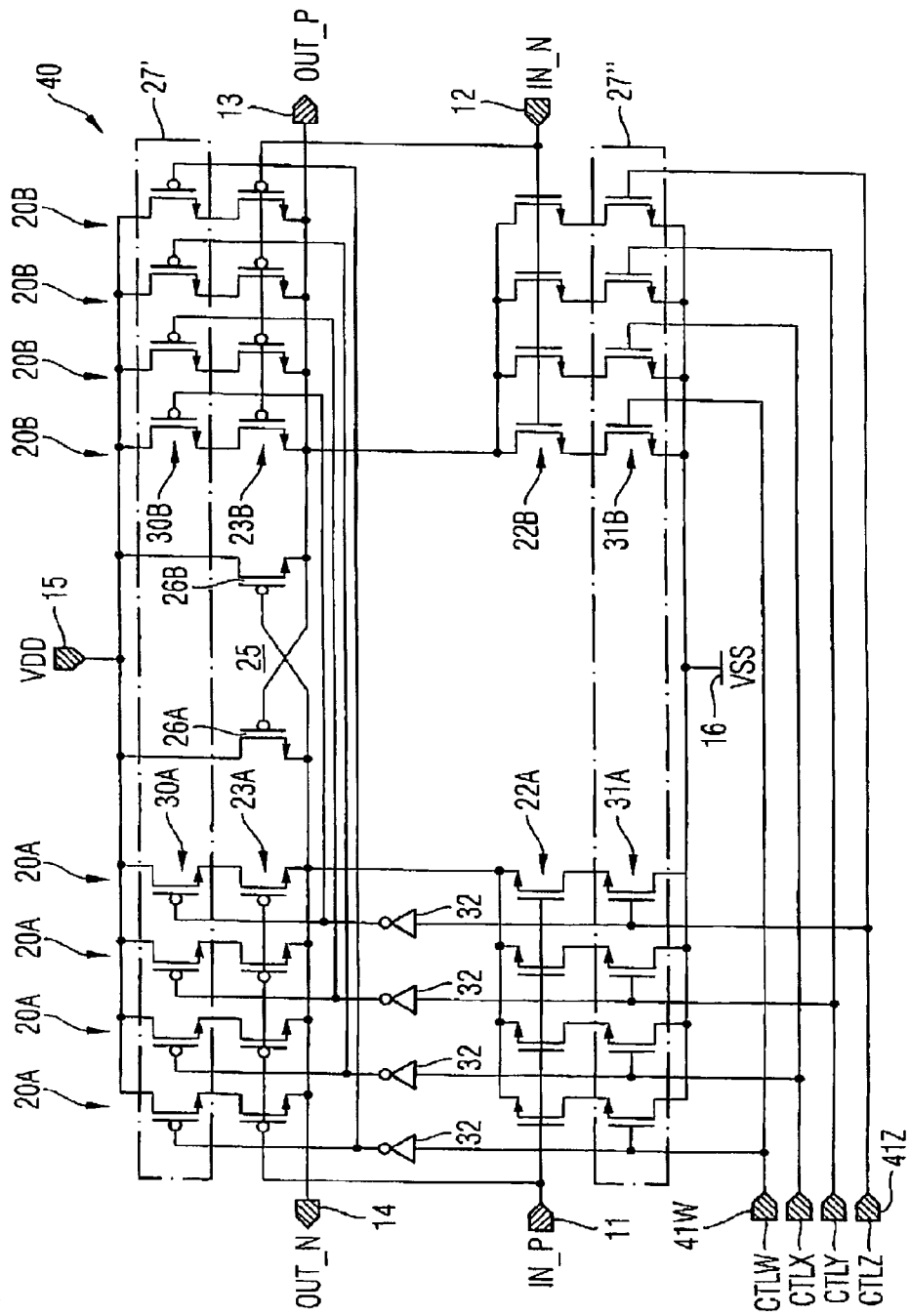
FIG. 5 shows a circuit arrangement of a single delay stage according to the embodiment in FIG. 4.

FIG. 5 shows a detailed circuit arrangement of a single delay stage according to the embodiment in FIG. 4.

The delay stage 40 comprises altogether four branches 20A and four complementary branches 20B to form four pairs of branches. Each one of these branches 20A and complementary branches 20B is constructed as shown in FIGS. 2 and 3A. Thus, each one of the branches 20A, 20B comprises one inverter 21A, 21B. All inverters 21A of the branches 20A are connected to a common input terminal 11. The taps 24A of these inverters 21A are shortened to each other and connected to the common output terminal 14. Thus, these inverters 21A and also the corresponding branches 20A on the one side of the delay stage 40 are arranged in parallel to each other with respect to the input terminal 11 and the output terminal 14, and also with respect to the supply terminals 15, 16.

Also, the inverters 21B within the complementary branches 20B are arranged in parallel to each other with respect to the input terminal 12 and the output terminal 13.

The delay stage 40 in FIG. 5 typically, but not necessarily, comprises one single positive feedback circuit 25 which is arranged between the four branches 20A on the left side and the four complementary branches 20B on the right side of the delay stage 40. Thus, this single positive feedback circuit 25 is assigned to all pair of branches.

Within the delay stage 40, in each case one branch 20A and one complementary branch 20B form a pair of branches. This means, that the delay stage 40 in FIG. 5 comprises altogether four pairs of branches with each one of these pairs of branches is connected on the control side to one of the control terminals 41W-41Z. Each one of these control terminals 41W-41Z is used to receive a control signal CTLW-CTLZ. These control signals CTLW-CTLZ typically, but not necessarily, are digital logic signals. These logic signals comprise a first voltage level, for example a low level, and a second voltage level, for example a high level. These voltage levels are provided to the control terminals of the transistors 30A, 31A, 30B, 31B within a corresponding pair of branches 20A, 20B. With these control signals CTLW-CTLZ, the transistors 30A, 30B, 31A, 31B within a corresponding pair of branches may be switched on or switched off. Thus, it is possible to activate or deactivate the different pairs of branches by the corresponding control signals CTLW-CTLZ.

By providing four different pairs of branches within one delay stage 40, it may be possible to activate and deactivate an arbitrary amount of pairs of branches. For example, by applying adequate control signals CTLW-CTLZ it may be possible to activate all of these pairs of branches with a consequence that all of the branches 20A are arranged in parallel to each other and all of the complementary branches 20B are also arranged in parallel to each other. Also, it may be possible only to select three, two or only one pair of branches, which are then connected in parallel to each other. In addition, it may also be possible to disconnect and, thus, deactivate all of the pairs of branches. By connecting and activating an arbitrary amount of pairs of branches by providing suitable control signals CTLW-CTLZ, it is possible to adjust the oscillation frequency of the delay stage 40 in a desired manner.

Figure 6:
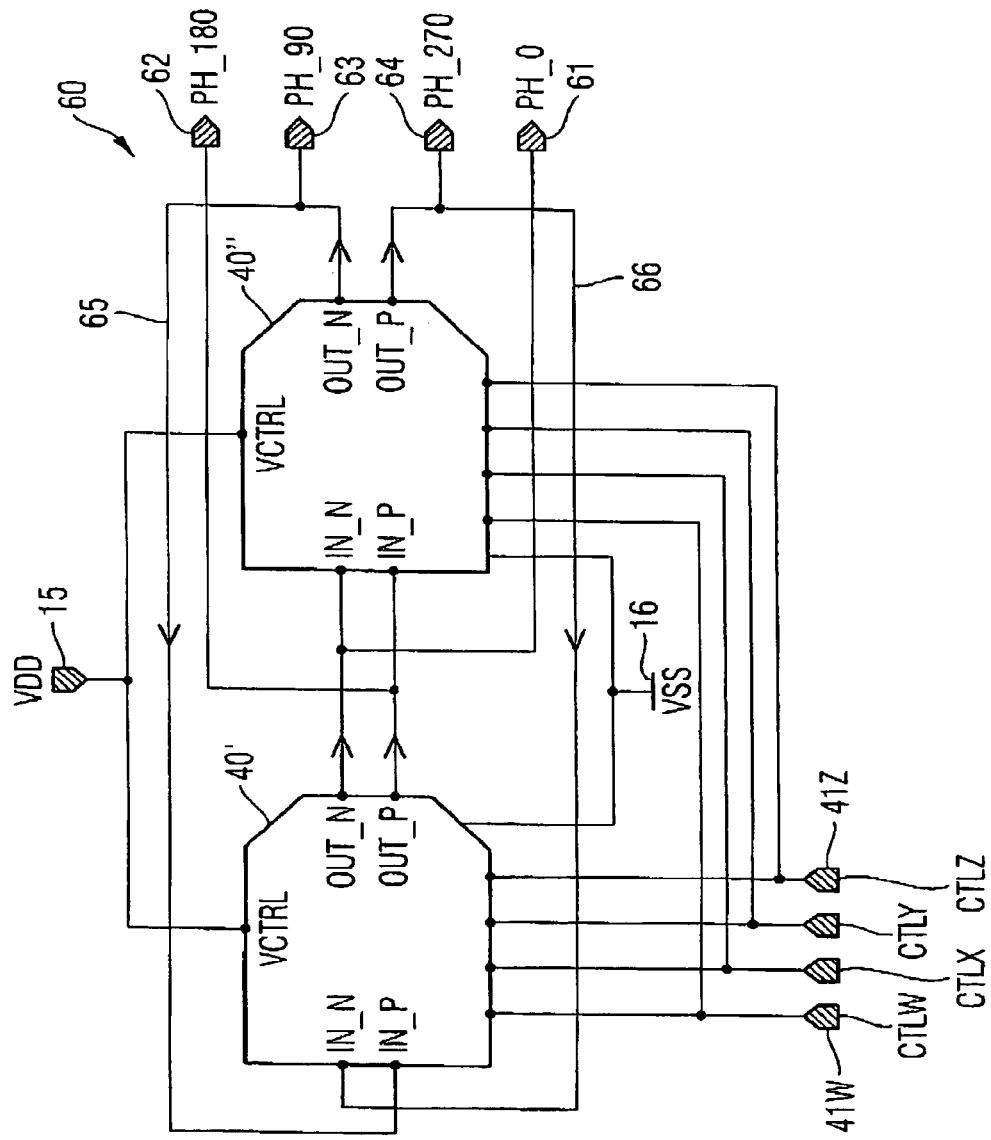
FIG. 6 shows a block-diagram illustrating a ring oscillator according to an embodiment of the present invention.

FIG. 6 shows a block diagram illustrating a ring oscillator according to an embodiment of the present invention.

A ring oscillator is a semiconductor circuit having a number of more or less identical and very simple inverting (delay) stages which are connected in series to each other with an output of each stage coupled to an input of the next stage and with the output of the last stage coupled to the input of the first stage. These delay stages of a ring oscillator each comprise an inverter having a pair of serially connected complementary transistors which are in CMOS technology metal-oxide semiconductor (MOS) transistors. The output of this transistors switches to a high logical level (high, "1"), when a low logical level (low, "0") is applied to the input terminals thereof, and switches to a low logical level when a high logical level is applied to the input terminals thereof. The frequency of operation of this type of oscillator is determined by the speed of progression of a switching event of low to high, and high to low from one delay stage to another around the ring of the ring oscillator and by the number of delay stages.

With regard to the embodiment in FIG. 6 the ring oscillator is denoted by reference symbol 60. The ring oscillator 60 comprises two delay stages 40', 40", whereas the second delay stage 40" is arranged downstream to the first delay stage 40' such that the output terminals of the first delay stage 40' are connected to the input terminals of the second delay stage 40", and the output terminals of the second delay stage 40" are coupled by feedback lines 65, 66 to the input terminals of the first delay stage 40'. Both delay stages 40', 40" use the same supply voltage V1=VDD−VSS.

Typically, but not necessarily, the delay stages 40', 40" are identical and correspond, for example, to the circuit arrangement of a delay stage 40 as shown in FIG. 5. That means, that both delay stages 40', 40" are connected to common control terminals 41W-41Z to receive the control signals CTLW-CTLZ.

However, it may also be possible to use different circuit arrangement for the two delay stages 40', 40". But, with regard to technology aspects during the fabrication of this ring oscillator 60, it is rather useful to use more or less identical or at least similar circuit arrangements for the two (or more) delay stages 40', 40".

The ring oscillator 60 comprises four output terminals 61-64.

At the first output terminal 61, a first output signal PH_0 is provided. At the second output terminal 62, a second output signal PH_180 is provided, which is 180 degrees phase-shifted with regard to the first output signal PH_0 at the first output terminal 61. These output terminals 61, 62 are connected to the output terminals of the first delay stage 40'.

At a third output terminal 63 of the ring oscillator 60, an output signal PH_90 is provided which is 90 degrees phase-shifted with regard to the first output signal PH_0 of the first output terminal 61. At a fourth output terminal 64, a fourth output signal PH_270 is provided which is on the one hand 180 degrees phase-shifted with regard to the third output signal PH_90 at the third output terminal 63, and which is 270 degrees phase-shifted with regard to the first output signal PH_0 at the first output terminal 61. The third and fourth output terminals 62, 64 are connected to the output terminals of the second delay stage 40".

With these four output signals PH_0, PH_90, PH_180, PH_270, it is possible to generate an output signal having basically four different frequencies.

Figure 7:
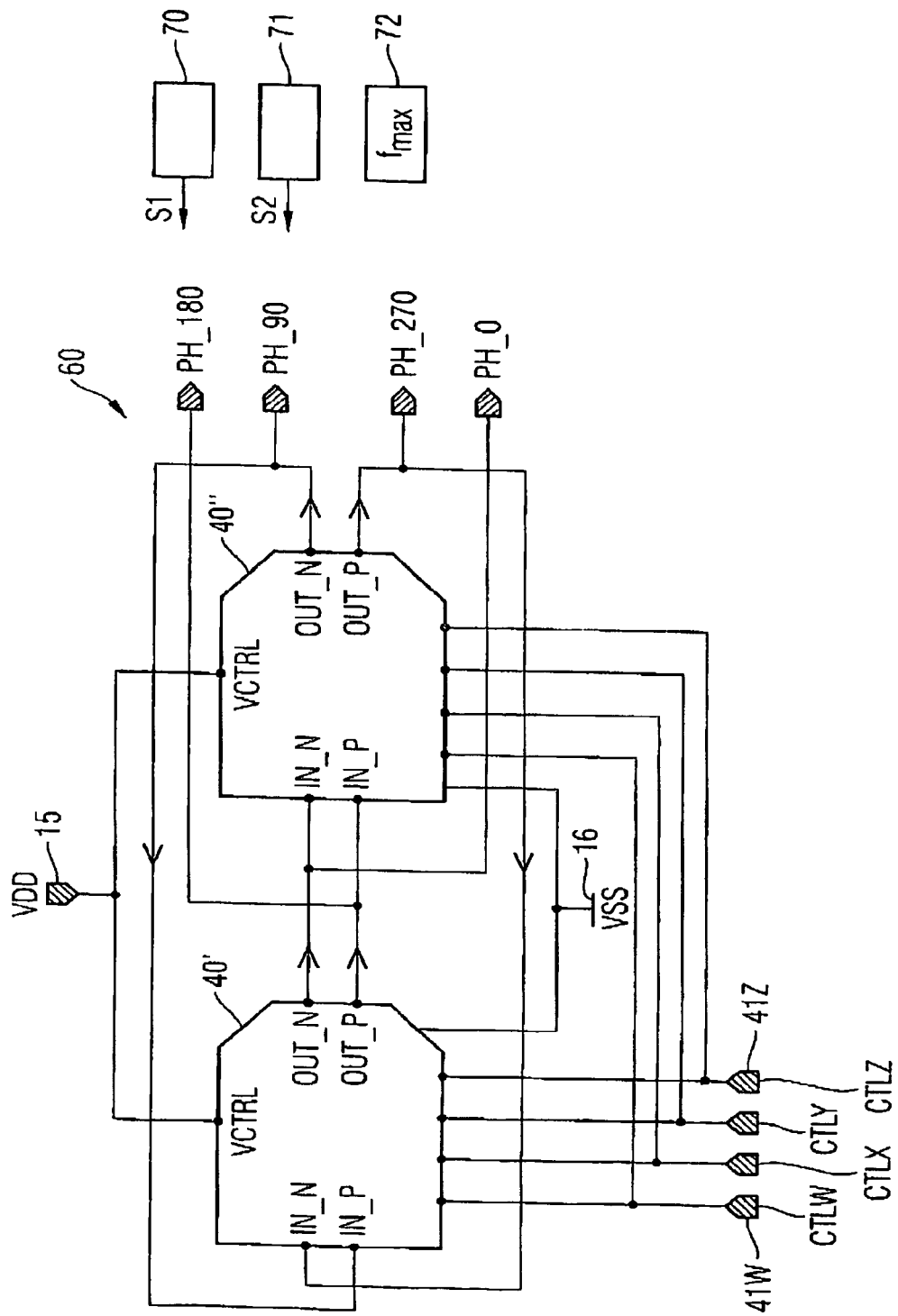
FIG. 7 shows a block-diagram illustrating a ring oscillator according to another embodiment of the present invention.

FIG. 7 shows a block diagram illustrating a ring oscillator according to another embodiment of the present invention.

In addition to the ring oscillator in FIG. 6 the ring oscillator 60 in FIG. 7 further comprises a supply voltage tuning circuit 70 to tune at least one of the first or the second supply potentials VDD, VSS via a tuning control signal S1. Further a start-up tuning circuit 71 is provided to tune the ring oscillator 60 to its maximum oscillation frequency via a further tuning control signal S2. The ring oscillator 60 further comprises at least one frequency divider 72. This frequency divider 72 is arranged in series connection with respect to the output terminal of the second delay stage (not shown in FIG. 7). The frequency divider 72 is designed to operate at the highest possible frequency fmax of the ring oscillator 60. Additional, or alternatively, the frequency divider 72 is designed to operate at the highest actual programmed frequency of the ring oscillator 60.

Figure 8:
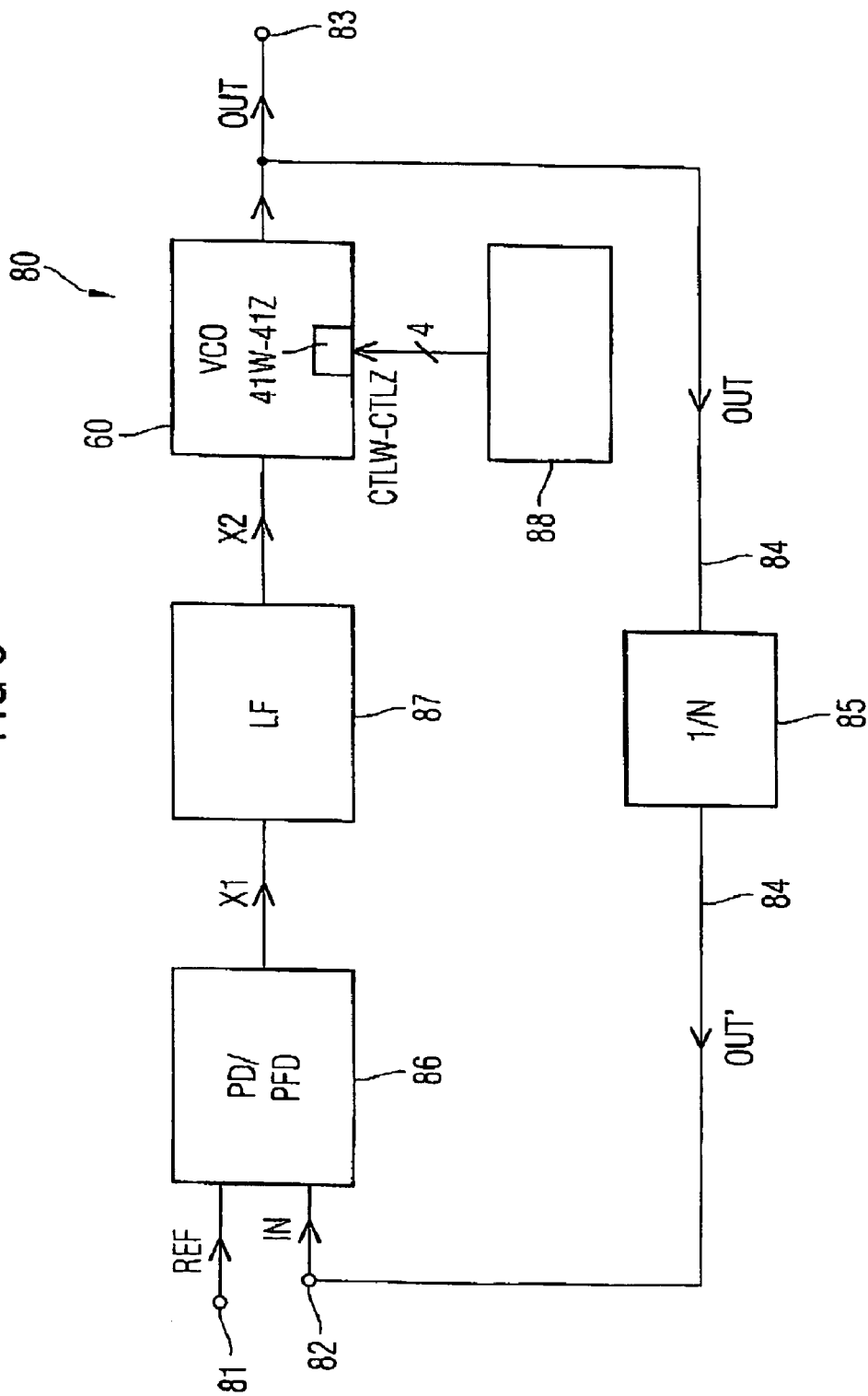
FIG. 8 shows a block-diagram illustrating a PLL-circuit according to an embodiment of the present invention.

FIG. 8 shows a block-diagram illustrating a PLL-circuit according to an embodiment of the present invention. In FIG. 8, the PLL-circuit is denoted by reference symbol 80. The PLL-circuit 80 comprises a first input terminal 81 to receive a reference signal REF and a second input terminal 82 to receive an input signal IN. The PLL-circuit 80 further comprises an output terminal 83 to provide an output signal OUT. The output terminal 83 is coupled via a feedback line 84 to the second input terminal 82 in order to feed back the output signal OUT to the input terminal 82. In the embodiment in FIG. 8, a divider 85 is arranged within the feedback line 84. The divider 85 comprises a division factor N which is used to divide the output signal OUT and provide a divided output signal OUT'. The divided output signal OUT' then forms the input signal IN.

The PLL-circuit 80 further comprises a phase detector 86, a loop filter 87 and an oscillator 60 which are arranged one after the other and between the two input terminals 81, 82 and the output terminal 83.

The phase detector 86 is designed to compare the reference signal REF and the input signal IN with each other and to provide a phase difference signal X1 which indicates the phase difference between the received input signal IN and the reference signal REF.

The loop filter 87 is designed to filter the phase difference signal X1 and to provide a filtered phase difference voltage signal X2. This filtered phase difference voltage signal X2 is then forwarded to the oscillator 60. The loop filter is typically, but not necessarily, a digital loop filter 87. The oscillator 60 is—in the embodiment in FIG. 8—a voltage controlled oscillator 60 (VCO) which is controlled by the voltage signal X2 and which is used to generate the output signal OUT which has a predefined frequency range. The voltage controlled oscillator 60 then generates—depending on the control signals CTLW-CTLZ—a periodic oscillating signal which then forms the output signal OUT.

In the present embodiment, the circuit arrangement of the voltage controlled oscillator 60 is a ring oscillator 60 and corresponds to the circuit arrangement of the ring oscillator shown in FIGS. 6, 7. Therefore, this oscillator 60 according to an embodiment of the present invention is designed to provide an output signal OUT with settable frequency range. To define a desired frequency in the output signal OUT, the oscillator 60 comprises control terminals 41W-41Z to receive different control signals CTLW-CTLZ by a control circuit 88. With this ring oscillator 60, it is possible to provide a very wide range of frequency in the output signal. However, the frequency variation in this output signal is not or hardly dependent on process variations, temperature variations and variations in the supply voltage.

Although exemplary embodiments of the present invention have been described above, the invention is not limited thereto but rather can be modified in a wide variety.

It will be understood by those skilled in the art that various changes and modifications especially in the circuitry may be made, and equivalences may be substituted for elements thereof without departing from the true scope of the invention. In addition, many modifications may be made to adapt a particular situation or material of the teaching of the invention without departing from the central scope thereof.

Furthermore, while embodiments of the present invention have been discussed mainly in connection with a CMOS technology, it is to be understood that the inventive principles also apply to other technologies, such as JFET, bipolar technologies and so on. Moreover, the transistors of the delay stages and ring oscillators of the describe embodiments may not necessarily be MOSFET-type transistors, but can also be JFETs, bipolar-transistors, IGBT, etc.

Also, the given numerical data are given only to a better understanding, however, they are not intended to limit the invention thereon.

In the above-mentioned embodiments of a delay cell or a ring oscillator, the delay cell in FIGS. 5-8 comprises four pairs of branches with each of them comprising a pair of inverters. However, the amount of pairs of complementary branches are not restricted to four, but may also be two, three or more than four. Also, a ring oscillator is not restricted to only two delay stages, but may also comprise more than two delay stages, such as four, six or any (even) number of delay stages.

Also the above embodiments were described with regard to a differential structure of the delay stage and the corresponding ring oscillator. However, it may also be possible and within the real scope of the present application to provide a delay stage without this differential structure. In this case it is not necessary to provide pairs of complementary branches. In this case single branches each having an inverter and two switching transistors are enough to connect in parallel a desired amount of branches to provide a desired output frequency.

What I claim is:

1. A delay stage for a semiconductor device, comprising:
    at least two pairs of complimentary delay branches in parallel, each pair of complimentary delay branches comprising at least one inverter, a first branch and a second branch; and
    at least one controllable switching apparatus, wherein an arbitrary amount of the at least two pairs of complimentary delay branches is connectable to a supply voltage to provide different frequency ranges depending on the amount of parallel connected delay branches.

2. The delay stage as claimed in claim 1, wherein the controllable switching apparatus has at least two different control signals, each of the different control signals connecting to different pairs of the complimentary delay branches, to activate or deactivate the different pairs of the complimentary delay branches to provide different frequency ranges depending on the amount of parallel connected delay branches.

3. The delay stage as claimed in claim 1, further comprising at least one output terminal configured to provide corresponding output signals having an output frequency set up by the controllable switching apparatus.

4. The delay stage as claimed in claim 1, wherein the controllable switching apparatus comprises controllable switches configured to connect the delay branches in parallel to each other.

5. The delay stage as claimed in claim 1, wherein the controllable switching apparatus comprises controllable switches configured to connect at least two pairs of complimentary delay branches to the supply voltage.

6. The delay stage as claimed in claim 1, further comprising at least one control terminal to receive at least one control signal, wherein the at least one control terminal is connected to corresponding control terminals of the controllable switching apparatus.

7. The delay stage as claimed in claim 1, further comprising an input terminal configured to receive an input signal.

8. The delay stage as claimed in claim 1, further comprising a first supply terminal configured to receive a first supply potential and a second supply terminal configured to receive a second supply potential wherein the second supply potential is lower than the first supply potential and wherein the supply voltage is derived from the first and the second supply potential.

9. The delay stage as claimed in claim 8, wherein the first supply potential is a positive supply potential and the second supply potential is a negative supply potential.

10. The delay stage as claimed in claim 1, wherein within at least a first of the delay branches is connectable to the first supply terminal via a first controllable switch, and is further connectable to the second supply terminal via a second controllable switch, wherein when the first and second controllable switches are switched off the first delay branch is disconnected from the supply voltage and when the first and second controllable switches are switched on the first delay branch is connected to the supply voltage.

11. The delay stage as claimed in claim 10, wherein the first and second controllable switches include semiconductor switches.

12. The delay stage as claimed in claim 10, wherein the first and second controllable switches include CMOS-based transistors.

13. The delay stage as claimed in claim 10, wherein the first and second controllable switches include digital switches designed to connect or disconnect a corresponding delay branch digitally by applying a digital control signal to their control terminals.

14. The delay stage as claimed in claim 1, wherein at least a first of the at least one inverters is connected to an input terminal to receive an input signal, wherein the first inverter is connected via the controllable switching apparatus to the supply voltage and wherein the first inverter is connected to an output terminal to provide the output signal.

15. The delay stage as claimed in claim 1, wherein each of the inverters are connected to a common input terminal and a common output terminal.

16. The delay stage as claimed in claim 1, wherein each of the inverters comprises a low output impedance and wherein each of the inverters is designed to load and unload a capacitive load of a further delay stage connectable downstream to an output terminal of the delay stage.

17. The delay stage as claimed in claim 1, wherein the delay stage is a differential delay stage.

18. The delay stage as claimed in claim 17, wherein the differential delay stage comprises two complementary input terminals to receive complementary input signals and two complementary output terminals to provide complementary output signals.

19. The delay stage as claimed in claim 17, wherein each one of the first and second branch within a pair of complementary delay branches comprises an inverter.

20. The delay stage as claimed in claim 17, wherein a positive feedback circuit is provided which is arranged between the first and second branches of the two pairs of complementary delay branches and which provides a positive feedback signal for each one of the first and second branch to support the oscillation.

21. The delay stage as claimed in claim 20, wherein the positive feedback circuit comprises two transistors having control terminals and output terminals that, the control terminals and output terminals of the two transistors cross-coupled.

22. A ring oscillator circuit, comprising:
a first delay stage; and
at least one second delay stage coupled to the first delay stage,
wherein at least one of the first and second delay stages comprising at least two pairs of complimentary delay branches in parallel, wherein each of the at least two pairs of complimentary delay branches includes at least one inverter and each pair of complimentary delay branches comprising a first branch and a second branch, and at least one controllable switching apparatus, wherein an arbitrary amount of the at least pairs of complimentary delay branches is connectable to a supply voltage to provide different frequency ranges depending on the amount of parallel connected delay branches.

23. The ring oscillator as claimed in claim 22, wherein the controllable switching apparatus has at least two different control signals, each of the different control signals connecting to different pairs of the complimentary delay branches, to activate or deactivate the different pairs of the complimentary delay branches to provide different frequency ranges depending on the amount of parallel connected delay branches.

24. The ring oscillator as claimed in claim 22, wherein the switching apparatus comprises controllable switches to connect the delay branches within the at least one first and second delay stages in parallel to each other.

25. The ring oscillator as claimed in claim 22, wherein the switching apparatus comprises controllable switches to connect the at least two pairs of complimentary delay branches within the at least one first and second delay stages to the supply voltage.

26. The ring oscillator as claimed in claim 22, further comprising an oscillator output terminal for providing an oscillator output signal having an oscillator frequency set up by the first and second delay stages.

27. The ring oscillator as claimed in claim 22, wherein each one of the delay stages comprises at least one input terminal and at least one output terminal, wherein the output terminals of the second delay stage are connected to the input terminals of the first delay stage and wherein the input terminals of the second delay stage are connected to the output terminals of the first delay stage.

28. The ring oscillator as claimed in claim 22, further comprising a supply voltage tuning circuit configured to tune at least one of the first or the second supply potentials.

29. The ring oscillator as claimed in claim 22, further comprising a start-up tuning circuit to tune the oscillator to the maximum oscillation frequency.

30. The ring oscillator as claimed in claim 22, further comprising at least one frequency divider, which is arranged in series connection with respect to the output terminal of the second delay stage.

31. The ring oscillator as claimed in claim 30, wherein the frequency dividers are designed to operate at the highest possible frequency of the oscillator.

32. The ring oscillator as claimed in claim 30, wherein the frequency dividers are designed to operate at the highest actual programmed frequency of the oscillator.

33. The ring oscillator as claimed in claim 22, wherein the oscillator is a voltage controlled oscillator.

34. A PLL-circuit, comprising:
an oscillator wherein the oscillator comprises a first delay stage and at least one second delay stage coupled to the first delay stage, wherein at least one of the first and second delay stages comprising at least one controllable switching apparatus and at least two pairs of complimentary delay branches in parallel wherein each of the at least two pairs of complimentary delay branches includes at least one inverter, and further wherein an arbitrary amount of the at least two pairs of complimentary delay branches of the corresponding delay stage is connectable to a supply voltage to provide different frequency ranges depending on the amount of parallel connected delay branches.

35. The PLL-circuit as claimed in claim 34, wherein the oscillator is a ring oscillator.

36. The PLL-circuit as claimed in claim 34, further comprising a first input terminal to receive an input signal, an output terminal to provide an output signal and a second input terminal to receive a second input signal derived from the output signal.

37. The PLL-circuit as claimed in claim 34, further comprising a phase detector and a loop filter wherein the phase detector, the loop filter and the oscillator are arranged one after the other and between the input terminals and the output terminal.

38. The PLL-circuit as claimed in claim 34, wherein the phase detector is a phase frequency detector.

39. The PLL-circuit as claimed in claim 34, wherein the phase detector is designed to generate a phase difference signal, which indicates the phase difference between the first and the second input signals.

40. The PLL-circuit as claimed in claim 34, wherein the loop filter is a digital loop filter.

41. The PLL-circuit as claimed in claim 39, wherein the loop filter comprises a low-pass filter to filter the phase difference signal and to provide a filtered phase difference voltage signal.

42. The PLL-circuit as claimed in claim 41, wherein the oscillator is controlled by the filtered phase difference voltage signal and the oscillator then generates the output signal of the PLL-circuit wherein the output signal has the predefined frequency range.

43. A method for operating a delay stage for a semiconductor device, comprising:
providing at least one controllable switching apparatus and at least two pairs of complimentary delay branches in parallel, wherein each of the at least two pairs of complimentary delay branches includes at least one inverter; and
switching at least one switch by providing corresponding control signals to corresponding control terminals of the corresponding switches to connect an arbitrary amount of the at least two pairs of complimentary delay branches of the corresponding delay stage to a supply voltage to provide different frequency ranges depending on the amount of parallel connected delay branches.

44. The method as claimed in claim 43, wherein the controllable switching apparatus has at least two different control signals, each of the different control signals connecting to different pairs of the complimentary delay branches, to activate or deactivate the different pairs of the complimentary delay branches to provide different frequency ranges depending on the amount of parallel connected delay branches.

45. The method as claimed in claim 43, wherein an output frequency of an output signal of the delay stage is set up by switching the at least one switch.

46. The method as claimed in claim 43, wherein an output frequency of an output signal of the delay stage is set up by switching the at least one switch of a switched capacitor network able switch to connect at least one capacitor to an output terminal of the delay stage.

47. A method for operating a ring oscillator circuit, comprising:
providing a first delay stage and at least one second delay stage coupled to the first delay stage, wherein at least one of the first and second delay stages comprising at least two pairs of complimentary delay branches, wherein each of the at least two pairs of complimentary delay branches includes at least one inverter, and at least one switching apparatus; and
switching at least one switch of the switching apparatus by providing corresponding control signals to corresponding control terminals of the corresponding switches to connect an arbitrary amount of the at least two pairs of complimentary delay branches to a supply voltage.

48. The ring oscillator as claimed in claim 47, wherein the predefined amount of delay branches are connected in parallel to each other.

49. The method as claimed in claim 47, wherein at least one supply potential is tuned.

50. The method as claimed in claim 47, wherein the oscillator is tuned to a maximum oscillation frequency.

51. The method as claimed in claim 47, wherein the oscillator is designed to operate at a highest possible frequency.

52. The method as claimed in claim 47, wherein the oscillator operates at a highest actual programmed frequency.

* * * * *